United States Patent [19]
Gau et al.

[11] Patent Number: 6,040,119
[45] Date of Patent: Mar. 21, 2000

[54] ELIMINATION OF PROXIMITY EFFECT IN PHOTORESIST

[75] Inventors: Tsai-Sheng Gau; Chang-Ming Dai, both of Hsinchu, Taiwan

[73] Assignee: Industrial Technology Research Institute, Hsin-Chu, Taiwan

[21] Appl. No.: 09/049,213

[22] Filed: Mar. 27, 1998

[51] Int. Cl.[7] ........................................... G03F 7/26
[52] U.S. Cl. ............................. 430/330; 430/322
[58] Field of Search ..................... 430/311, 313, 430/322, 325, 330, 396; 355/52, 71, 93, 67

[56] References Cited

U.S. PATENT DOCUMENTS

| | | | |
|---|---|---|---|
| 4,988,284 | 1/1991 | Liu et al. | 430/296 |
| 5,436,114 | 7/1995 | Itoo et al. | 430/311 |
| 5,636,004 | 6/1997 | Ootaka et al. | 355/67 |
| 5,680,588 | 10/1997 | Gortych et al. | 395/500 |
| 5,736,280 | 4/1998 | Tsudaka et al. | 430/30 |
| 5,834,531 | 11/1998 | Schacht et al. | 522/178 |
| 5,835,227 | 11/1998 | Grodnensky et al. | 356/399 |
| 5,852,128 | 12/1998 | Padmanaban et al. | 525/328.8 |
| 5,867,253 | 2/1999 | Nakae | 355/52 |
| 5,879,857 | 3/1999 | Chandross et al. | 430/270.1 |
| 5,882,844 | 3/1999 | Tsuchiya et al. | 430/288.1 |

*Primary Examiner*—Kathleen Duda
*Attorney, Agent, or Firm*—George O. Saile; Stephen B. Ackerman

[57] ABSTRACT

The proximity effect in photoresist patterns has been eliminated by carefully controlling the values of three independent variables that are involved in the photolithographic process. These are the temperature at which Post Exposure Bake is performed, the numerical aperture of the exposure system and the partial coherence parameter. Specifically, the Post Exposure Bake temperature should be 20–25° C. lower than that recommended by the manufacturer, the numerical aperture should be around 0.5 and the partial coherence parameter around 0.8. If these guidelines are followed, no proximity effect is in evidence down to duty ratios less than 1 and distortion-free patterns are obtained without the need for an Optical Proximity Correction.

5 Claims, 3 Drawing Sheets

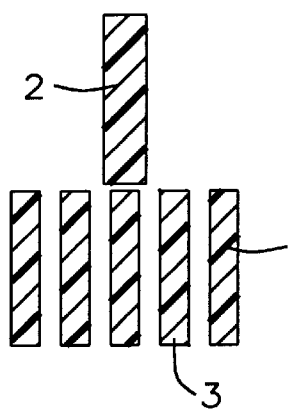
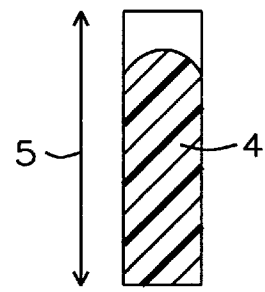
FIG. 1a – Prior Art      FIG. 1b – Prior Art
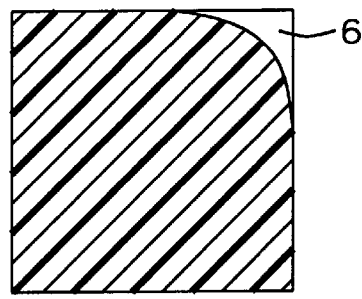
FIG. 1c – Prior Art
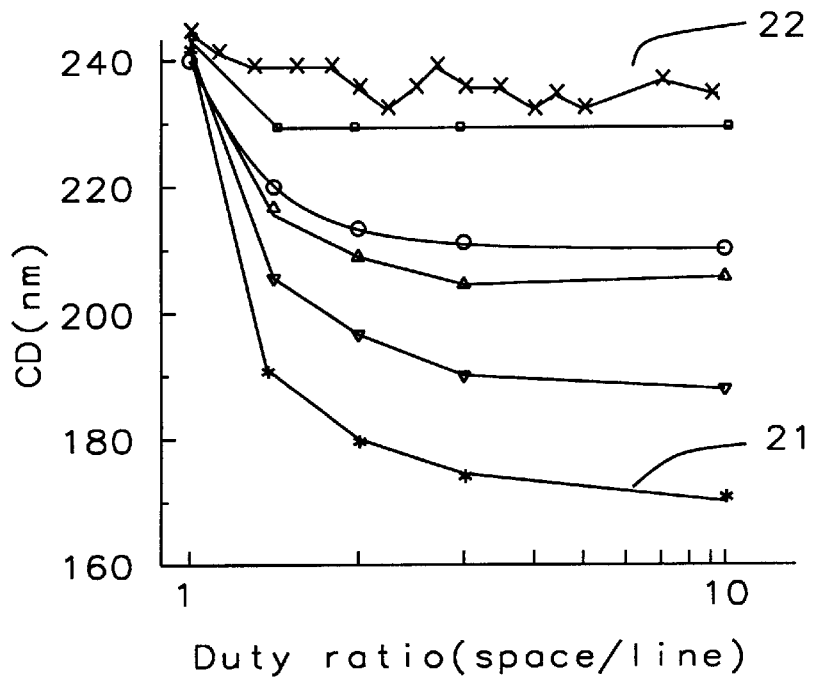
FIG. 2

ELIMINATION OF PROXIMITY EFFECT IN PHOTORESIST

FIELD OF THE INVENTION

The invention relates to the general field of photolithography with particular reference to the proximity effect and methods for its elimination.

BACKGROUND OF THE INVENTION

The patterns in an integrated are created by etching under a photoresist mask that was formed from a glass mask through a photolithographic process. The size of the minimum feature in an integrated circuit is usually referred to as the critical dimension (CD). As the CD approaches the wavelength of the light that was used to image the glass mask and expose the photoresist (between about 1830 and 3650 Angstroms for a Deep UV source), the patterns formed in the photoresist cease to reproduce the patterns on the glass mask with complete fidelity. Because the effect on any given feature is greatly influenced by the feature's surroundings, the phenomenon has been named 'the proximity effect'.

FIGS. 1a–c illustrate three different manifestations of the proximity effect. In FIG. 1a line 2 is isolated and has no immediate neighbours whereas lines such as 3 are crowded together, being separated by a space that is comparable to their width. Although lines 3 and line 2 had the same width on the glass mask from which they were imaged onto the photoresist, the proximity effect has caused lines 3 to be narrower than line 2. In FIG. 1b, line 4 on the glass mask had a length corresponding to dimension 5 but, in the photoresist image, it was considerably shortened, as shown. In FIG. 1c, the rounding effect of a corner that was intended to be square is shown, photoresist being absent from the area marked as 6.

Although the origins of the proximity effect are understood, calculating its magnitude for any given pattern can be very complicated and time consuming. Nevertheless, it is currently the general practice of the semiconductor industry to perform such calculations in order to generate an Optical Proximity Correction (OPC) which can be applied to the original glass mask pattern to compensate for the anticipated optical proximity effects.

The process of transferring the glass pattern to a photoresist image can be broadly summarised into four steps: 1) resist coating, 2) exposure, 3) post exposure bake (PEB) and 4) development. The surface on which the resist is coated may or may not be an anti-reflection coating (ARC). This is relevant as the proximity effect will be influenced by (among other things) the degree to which standing wave patterns are formed within the photoresist layer. However, it turns out that steps 2 and 3 are where proximity effects are introduced and, furthermore, by carefully controlling the conditions under which these two steps are implemented, the proximity effect can be eliminated, thereby removing the need for the OPC and associated costly calculations.

During a search for possible prior art, several references were found to be of interest. These include Itoo et al. (U.S. Pat. No. 5,436,114 July 1995), Ootaka et al. (U.S. Pat. No. 5,636,004 June 1997), and Gortych et al. (U.S. Pat. No. 5,680,588 October 1997) all of whom discuss the importance of numerical aperture and/or coherency. Liu et al (U.S. Pat. No. 4,988,284 January 1991) teach the need for a Post Exposure Bake but this is for electron beam resists and, furthermore, a temperature of at least 100° C. is specified.

SUMMARY OF THE INVENTION

It has been an object of the present invention to provide a method of removing any distortion in photoresist patterns that are due to the proximity effect.

A further object has been that said removal of distorting effects be through elimination of the proximity effect itself, as opposed to merely compensating for it.

Yet another object has been that said method not add to the cost relative to a photolithographic process in which no allowance has been made for the proximity effect.

These objects have been achieved by carefully controlling the values of three independent variables that are involved in the photolithographic process. These are the temperature at which Post Exposure Bake is performed, the numerical aperture of the exposure system and the partial coherence parameter. Specifically, the Post Exposure Bake temperature should be 20–25° C. lower than that recommended by the manufacturer, the numerical aperture should be around 0.5 and the partial coherence parameter around 0.8. If these guidelines are followed, no proximity effect is in evidence down to duty ratios less than 1.

BRIEF DESCRIPTION OF THE DRAWINGS

FIGS. 1a to 1c illustrate how the proximity effect can distort the shape and dimensions of lines in a photoresist image.

FIG. 2 is a plot of CD vs. duty ratio for a series of different PEB peratures.

DESCRIPTION OF THE PREFERRED EMBODIMENTS

As briefly mentioned earlier, the two steps in photolithography that determine the nature and extent, if any, of the proximity effect are exposure and post exposure bake (PEB). Effects introduced during exposure are purely optical in origin and for effects introduced during PEB, the proximity effects from the resist are dominant.

Referring now to FIG. 2, we show there a plot of the CD (in microns) as a function of the duty ratio ((line spacing)/line width) for a series of different PEB temperatures. The range of CD values that is of interest is between about 0.18 and 0.35 microns. Bake time for PEB was the same in all cases and equalled about 2 minutes but, after a minimum bake time of about one minute, bake time per se was unimportant. The data was acquired using K30G resist and a bottom ARC (BARC) was present.

The bake temperature for curve 21 was 100° C., the value recommended by the resist manufacturer. The bake temperature for each successive curve shown above 21 was reduced by 5° C. each time, culminating at curve 22 which was for a bake temperature of 75° C. As can be seen, the CD is in general very sensitive to duty ratios less than about 3 but this sensitivity decreases significantly at the lower PEB temperatures. In fact, for a PEB temperature of 75° C. (curve 22) the change in CD over the full duty ratio range is only about 4%.

Figure 3:
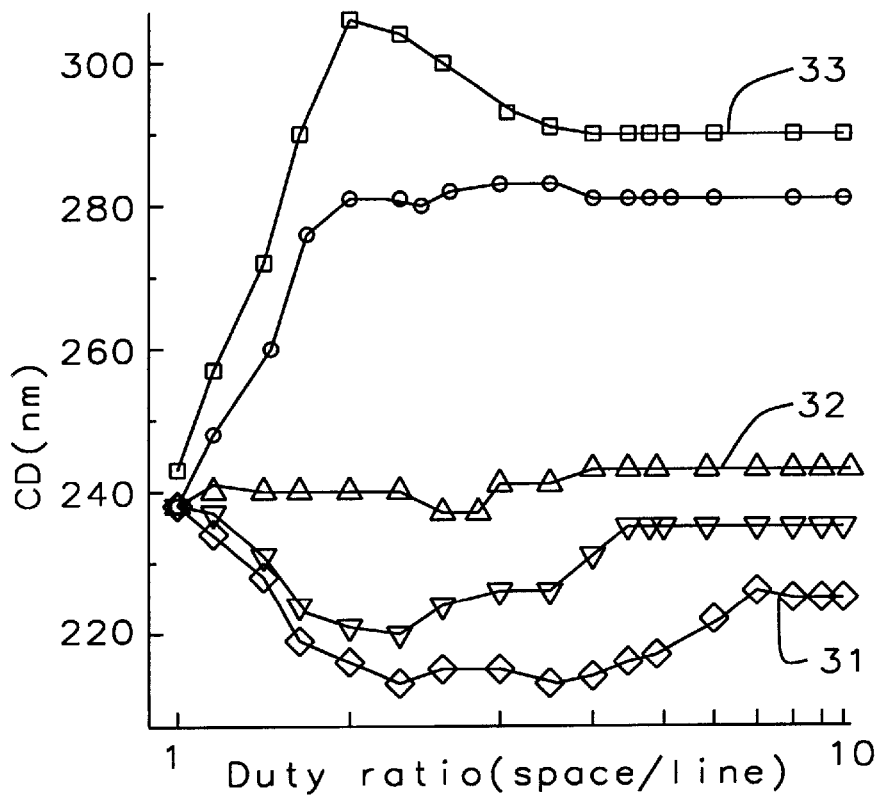
FIG. 3 shows simulated curves of CD vs. duty ratio for a series of different values of the partial coherence parameter.

In FIG. 3 we illustrate the purely optical effects that control the proximity effect. In this case the PEB temperature was assumed to have been the optimum discussed above and, using simulation techniques, the effects of two key optical parameters were systematically investigated.

The two optical parameters that were used for simulation were the numerical aperture (NA) (which can be adjusted by using an iris diaphragm) and the partial coherence parameter ($\sigma$). The latter is defined as (Illumination NA)/(Projection NA). It can be determined, for a given optical system, by measuring these two quantities, and it can be adjusted by modifying the AERIAL illuminator (for an ASM stepper) or by enlarging the filter size (for a Nikon stepper).

In FIG. 3, as in the other figures shown below, the NA was kept fixed at 0.55. As in the PEB case, this number was the highest NA available to us. As we have confirmed on many occasions, the larger the NA, the smaller the proximity effect. For curve 31, the coherence parameter was 'annular ⅔', since for these cases an annular incident light distribution (inner:outer radius of annulus=⅔) was used.

For curve 32 $\sigma$ was 0.8 (the largest value attainable with the Nikon X12B stepper) while for curve 33 it was 0.4. The data shows that, for NA of 0.55, a a value of 0.8 results in a CD vs duty ratio curve that is almost a flat line, implying that the proximity effect has been totally eliminated.

Figure 4:
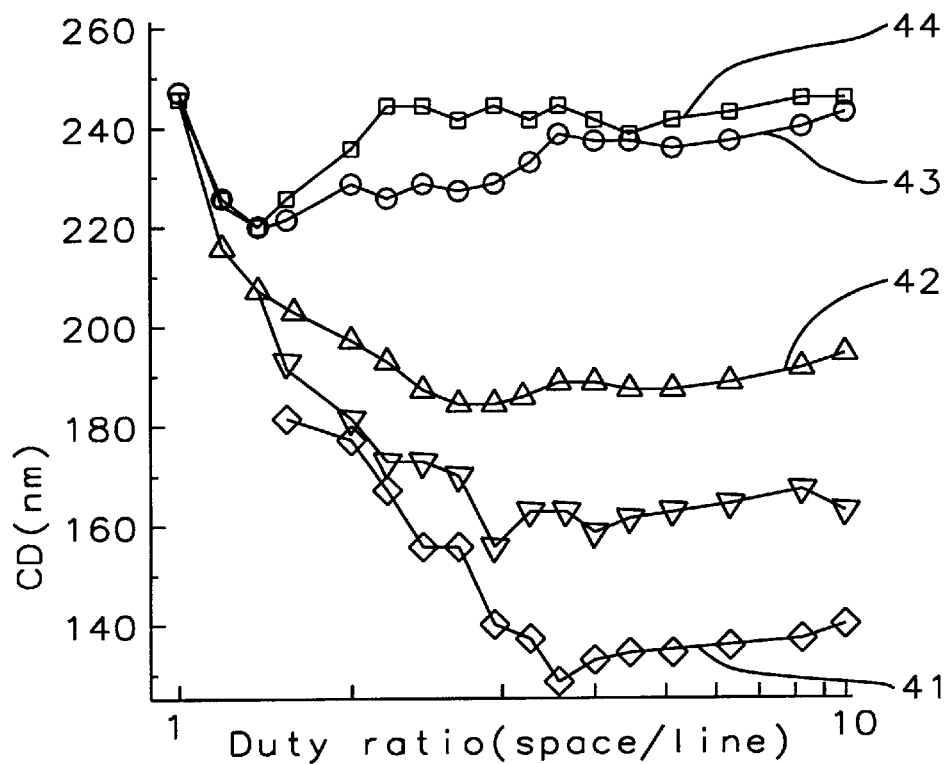
FIG. 4 shows experimental data for CD vs. duty ratio for several different values of the partial coherence parameter using the PEB temperature recommended by the manufacturer.

To Confirm that these results were real, and not due to poor simulation, experiments were performed on a real resist (type JSR K2G) which was laid down to a thickness between about 0.5 and 0.8 microns. In FIG. 4 results are plotted for a series of exposures that were performed using various a values but at a PEB temperature of 100° C. (the manufacturer's preferred value). a values were as follows: for curve 41 annular ⅔, for 42 0.8, for 43 0.55, and for 44 0.4. As before, NA was fixed at 0.55. As can be seen, although curves 43 and 44 come closest, none of the curves can be said to be flat, implying that proximity effects were still present.

Figure 5:
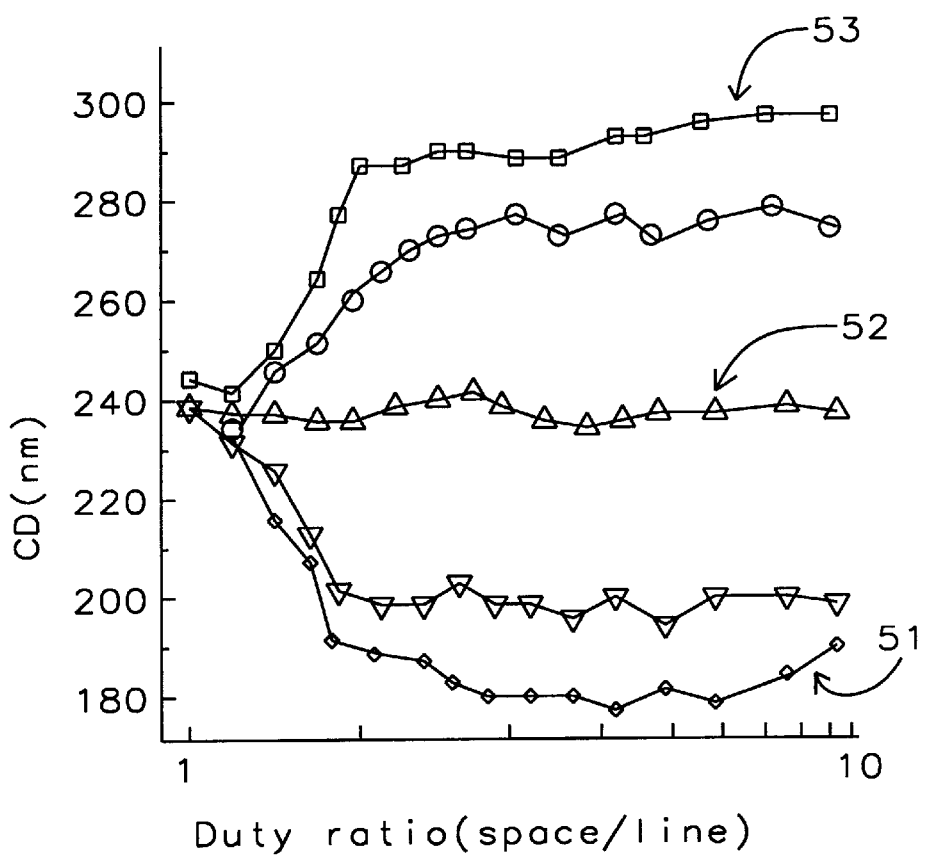
FIG. 5 shows experimental data for CD vs. duty ratio for several different values of the partial coherence parameter using a PEB temperature determined according to the teachings of the present invention.

The above experiment was repeated but this time the optimum PEB temperature (80° C. in this case) was used. The results are shown in FIG. 5. With NA still fixed at 0.55, a values were as follows: for curve 51 annular ⅔, for 52 0.8, and for 53 0.4. As can be seen in curve 52, for a a value of 0.8, the CD was independent of the duty ratio down to duty ratio values less than 1 confirming that by properly controlling PEB temperature, numerical aperture, and the partial coherence parameter, the proximity effect can be effectively eliminated. It should also be noted that we obtained our best results with the t-BOC series of photoresists.

While the invention has been particularly shown and described with reference to the preferred embodiments thereof, it will be understood by those skilled in the art that various changes in form and details may be made without departing from the spirit and scope of the invention.

What is claimed is:

1. A process for photolithography, comprising:

providing an optical mask;

coating a substrate with a layer of photoresist, said photoresist having been supplied by a manufacturer together with recommended ranges for processing;

drying the layer of photoresist;

using actinic radiation having a partial coherence value between 0.6 and 0.9, and projecting an image of the mask on the layer of photoresist by means of an imaging system having a numerical aperture between 0.5 and 0.7, for a first time period;

and then baking the substrate and photoresist, at a temperature that is between 20 and 25° C. lower than the ranges recommended by the manufacturer, for a second time period; and then developing said layer of photoresist whereby an image that is free of proximity effects, and having a critical dimension, is produced.

2. The process of claim 1 wherein said second time period is between 1 and 2 minutes.

3. The process of claim 1 wherein the actinic radiation has a wavelength between 1830 and 3650 Angstroms.

4. The process of claim 1 wherein said layer of photoresist has a thickness between 0.5 and 0.8 microns.

5. The process of claim 1 wherein said critical dimension is between 0.18 and 0.35 microns.

* * * * *